United States Patent
Hou et al.

(10) Patent No.: US 6,676,770 B2
(45) Date of Patent: Jan. 13, 2004

(54) APPARATUS AND METHOD FOR REMOVING PARTICLES FROM WAFER PODS

(75) Inventors: Wuei-Lung Hou, Fengshan (TW); Chi-Lung Yang, Hsinchu (TW); Ming-Chi Ho, Jubei (TW); Hong-Yi Chen, Banchiau (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 70 days.

(21) Appl. No.: 10/102,289

(22) Filed: Mar. 19, 2002

(65) Prior Publication Data
US 2003/0178046 A1 Sep. 25, 2003

(51) Int. Cl.[7] .................................................. B08B 3/00
(52) U.S. Cl. .............................. 134/34; 134/37; 15/302; 15/303; 15/309.2; 15/316.1
(58) Field of Search ............................. 134/21, 32, 33, 134/34, 36, 37, 96.1, 96.2, 97.1, 167 R, 168 R, 169 R; 15/302, 303, 309.2, 316.1, 102

(56) References Cited

U.S. PATENT DOCUMENTS

| | | | | |
|---|---|---|---|---|
| 5,806,138 A | * | 9/1998 | Kawasaki | 15/303 |
| 5,858,112 A | * | 1/1999 | Yonemizu et al. | 134/6 |
| 5,896,674 A | * | 4/1999 | Kim et al. | 34/480 |
| 6,059,893 A | * | 5/2000 | Kawasaki | 134/37 |
| 6,491,764 B2 | * | 12/2002 | Mertens et al. | 134/36 |

* cited by examiner

Primary Examiner—Frankie L. Stinson
Assistant Examiner—Saeed Chaudhry
(74) Attorney, Agent, or Firm—Tung & Associates

(57) ABSTRACT

An apparatus and method useful for removing potential wafer-contaminating particles from semiconductor wafer pods. The apparatus includes a rotatable air sprinkler which is mounted in a housing and connected to a source of clean, dry air (CDA) . The air sprinkler rotates as the air is distributed under pressure through the sprinkler and ejected from nozzles in the sprinkler. The ejected air impinges against a semiconductor wafer pod placed on the housing, above the air sprinkler to dislodge or remove particulate contaminants from the pod and prevent or at least significantly reduce the likelihood of particle contamination during transport of the pod and/or processing of the wafers in the pod.

20 Claims, 3 Drawing Sheets

APPARATUS AND METHOD FOR REMOVING PARTICLES FROM WAFER PODS

FIELD OF THE INVENTION

The present invention relates to pods for transporting semiconductor wafers in a semiconductor production facility. More particularly, the invention relates to an apparatus and method for removing particles from semiconductor wafer pods to prevent particle contamination of wafers in a semiconductor production facility.

BACKGROUND OF THE INVENTION

A standardized mechanical interface (SMIF) system is disclosed in U.S. Pat. Nos. 4,532,970 and 4,534,389. Such a SMIF system is designed to reduce particle fluxes onto semiconductor wafers and/or reticles in a semiconductor production facility. The SMIF system prevents or minimizes particle contamination of the wafers during transport and storage of the wafers by ensuring that gaseous media surrounding the wafers is essentially stationary relative to the wafers, and further, by preventing exposure of the wafers to particles from the ambient environment.

The SMIF concept is based on the use of a small volume of motion- and contamination-controlled, particle-free gas to provide a clean environment for semiconductor wafers and other articles. Further details of one such system are described in a paper entitled, "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115.

SMIF systems are designed to prevent contamination by particles which range from below 0.02 $\mu$m to above 200 $\mu$m. Due to the small geometries of the components in modern semiconductor integrated circuits, particles falling within this size range can significantly adversely affect semiconductor processing. Current geometry sizes for semiconductor integrated circuits have reached less than half a micron, and those circuits are adversely affected by particles having a size as small as 0.01 $\mu$m. In the future, semiconductor integrated circuits will be marked by increasingly smaller geometry sizes, requiring protection from contamination by correspondingly smaller particles.

A SMIF system has three main components: (1) sealed pods, or containers, each of which has a minimal volume and is used for storing and transporting cassettes holding reticles or wafers; (2) enclosures placed over cassette ports and wafer processing areas of processing equipment such that the environments inside the pods and enclosures (after being filled with clean, dry air) become miniature clean spaces; and (3) a transfer mechanism which is used to load and unload wafer cassettes from a sealed pod without contamination of the wafers in the wafer cassette from external environment.

Semiconductor wafers are stored and transported in pods, and are transferred from a pod to processing equipment in the following manner. First, a pod is placed at the interface port of a processing tool. Each pod includes a box and a box door designed to mate with doors on the interface ports of the processing equipment enclosures. Then, latches release the box door, and the box door and the interface port door are opened simultaneously such that particles which may have adhered to the external door surfaces are trapped or sandwiches between the box and interface port doors. A mechanical elevator lowers or translates the two doors, with the cassette riding on top, into the enclosure-covered space. The cassette is transferred by gravity or a manipulator and placed onto the cassette platform of the equipment. After processing, the reverse operation takes place.

The SMIF system has proven effective for preventing or reducing particle contamination both inside and outside a clean room, and provides at least a ten-fold improvement over the conventional handling of open cassettes inside the clean room. Thus, the SMIF system has significantly enhanced the functional integrity of semiconductor integrated circuits and increased the efficiency of semiconductor fabrication facilities.

One of the limitations of the SMIF system is that particle contamination remains a potential problem upon attachment of the pod to the processing equipment, as particles sandwiched between the box door of the pod and the interface port door of the processing equipment may become dislodged from between those elements and fall onto the semiconductor wafers as the wafers are lowered into the processing equipment. Conventional techniques for ameliorating these effects include manually wiping the bottom surface of the pod box door to clean the door of the particles before placement of the pod on the interface port door. However, this technique requires additional manpower and fails to effectively clean particulate contaminants from the pod box door.

SUMMARY OF THE INVENTION

Accordingly, an object of the present invention is to provide an apparatus and method for preventing or reducing particle contamination of semiconductor integrated circuits or wafer substrates during the transport and processing of semiconductor wafers.

Another object of the present invention is to provide an apparatus and method for removing contaminants from a semiconductor wafer pod during transport and processing of semiconductor wafers in a semiconductor production facility.

Still another object of the present invention is to provide an apparatus and method for removing contaminants from the bottom surface of a semiconductor wafer pod using air or gas.

Yet another object of the present invention is to provide an apparatus which utilizes impingement of air in a sprinkling pattern against the surface of a semiconductor wafer pod to dislodge or remove particles from the pod in the transport and/or processing of semiconductor wafers.

A still further object of the present invention is to provide an apparatus and method which removes a substantial quantity of particulate contaminants from a semiconductor wafer pod to prevent or reduce the likelihood of particulate contamination of semiconductor integrated circuits or semiconductor wafer substrates in the production and/or transport of semiconductor wafers in a semiconductor production facility.

In accordance with these and other objects and advantages, the present invention comprises an apparatus including a rotatable air sprinkler which is mounted in a housing and connected to a source of clean, dry air (CDA). The air sprinkler rotates as the air is distributed under pressure through the sprinkler and ejected from nozzles in the sprinkler. The ejected air impinges against a semiconductor wafer pod placed on the housing, above the air sprinkler to dislodge or remove particulate contaminants from the pod and prevent or at least significantly reduce the likelihood of particle contamination during transport of the pod and/or processing of the wafers in the pod.

BRIEF DESCRIPTION OF THE DRAWINGS

The present invention will now be described, by way of example, with reference to the accompanying drawings, in which.

DESCRIPTION OF THE PREFERRED EMBODIMENTS

The present invention has particularly beneficial utility in application to removing potential wafer-contaminating particles from semiconductor wafer pods in a semiconductor production facility. However, the invention is not so limited in application and while references may be made to such semiconductor wafer pods, the invention may be more generally applicable to removing particles from surfaces in a variety of industrial and product applications.

When used herein, the term "clean dry air" or "air" is not limited to air but could include other gases such as nitrogen. When used herein, the term "housing" means any support or enclosure capable of supporting a wafer pod or other surface for the removal of particles therefrom.

Figure 1A:
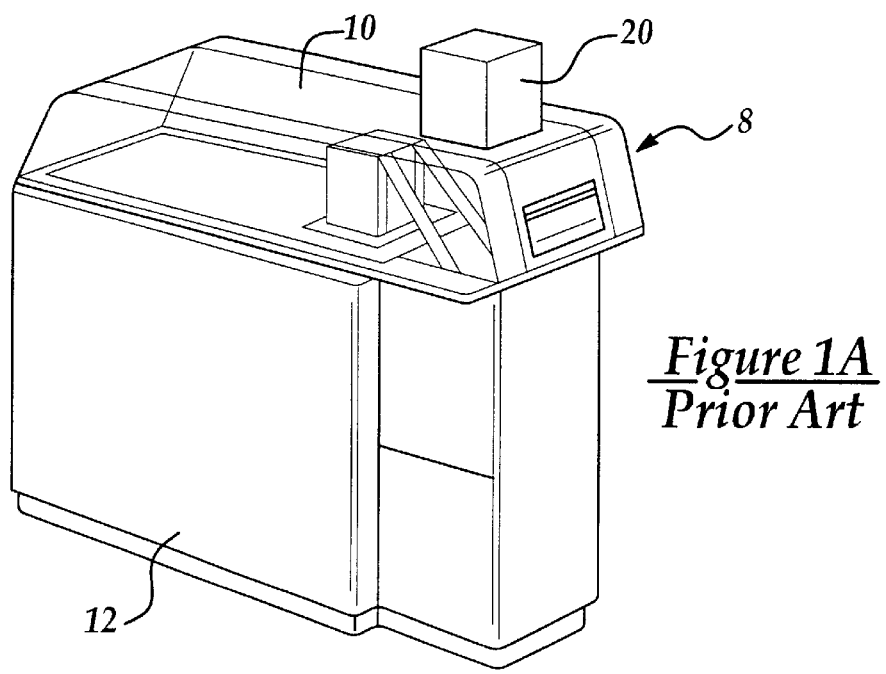
FIG. 1A is a perspective view of a conventional processing station, used in the processing of semiconductor wafers in a semiconductor production facility, with a conventional semiconductor wafer pod attached to the station.
Figure 1B:
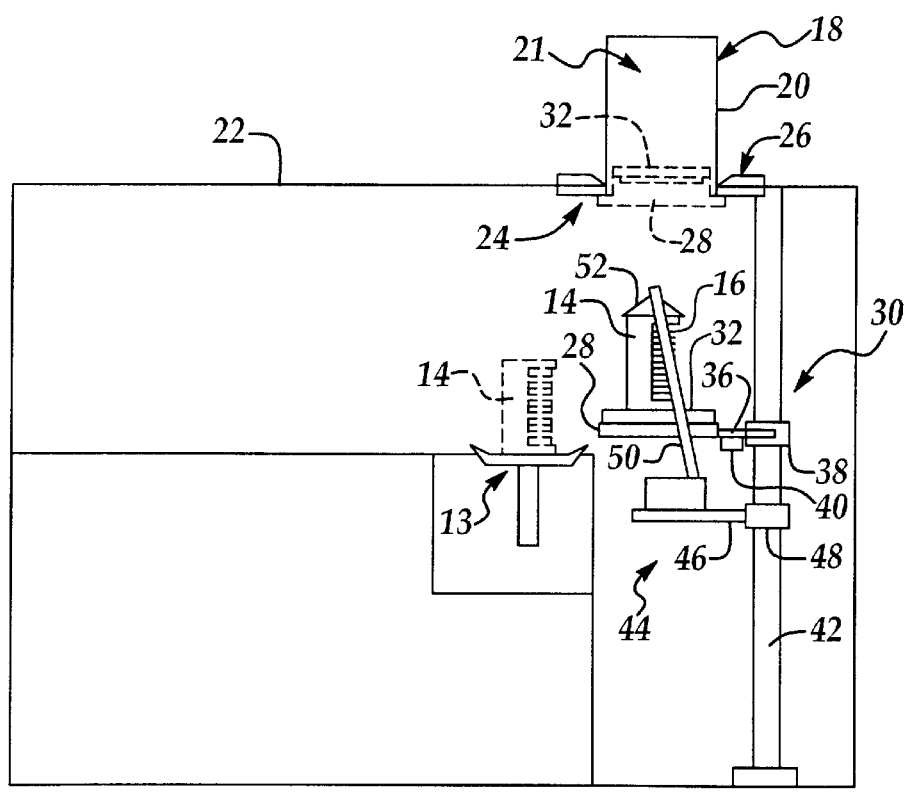
FIG. 1B is a longitudinal sectional view of the processing station illustrated in FIG. 1, showing interior components of the station and illustrating removal of semiconductor wafers from the wafer pod.

Referring initially to FIGS. 1A and 1B of the drawings, a conventional standardized mechanical interface (SMIF) system is shown in conjunction with a processing station 8 for processing semiconductor wafers. The processing station 8 is fitted with a removable canopy 10 that normally covers an internal wafer handling mechanism for processing equipment 12 such as a photoresist applicator, mask aligner or inspection station, for example, in the processing station 8. The canopy 10, which is constructed of a transparent plastic such as acrylic or lexan to facilitate visual inspection and/or maintenance within the canopy 10, encloses the handling mechanism for the processing equipment 12, as well as a wafer holder 14 such as a wafer cassette that holds semiconductor wafers 16. The interior of the processing equipment 12 is maintained and cleaned separately from the ambient environment of the processing equipment 12; therefore, the processing equipment 12 need not necessarily be installed in a clean room.

In operation of the SMIF system, a sealable transportable container or pod 18, including a box 20 having an interior region 21 and a removable box door 32, is removably attached to a port assembly 24 on a planar surface 22, typically the upper surface, of the canopy 10. The port assembly 24 includes a port plate 26, a removable port door 28 and an elevator assembly 30. In a manner hereinafter further described, the elevator assembly 30 transports a cassette 14 containing semiconductor wafers 16 downwardly from the interior region 21 of the box 20 and into the region beneath the canopy 10, with the port door 28 of the port assembly 24 and the box door 32 of the pod 18 removed from their original positions and resting on a platform 36 of the elevator assembly 30. Conversely, the platform 36 can be driven upwardly on the vertical guide 42 to re-insert the cassette 14 containing processed wafers 16 in the interior region 21 of the same or a different pod 18, or to replace the port door 28 on the port assembly 24 and the box door 32 on the empty pod 18. In either case, the port door 28 again closes the port opening in the canopy 10 and the box door 32 again closes the pod 18, as illustrated by the broken lines.

In FIG. 1B, the port door 28 of the port assembly 24 and the box door 32 of the box 20 are shown in the closed positions by the dotted lines. The elevator assembly 30 includes a platform 36, attached by an engagement device 38 to a vertical guide 42 of the elevator assembly 30. A drive motor 40 operably engages the platform 36 and the vertical guide 42 for driving the platform 36 vertically along the vertical guide 42. Accordingly, the platform 36 carries the port door 28, box door 32 and cassette 14 vertically inside the processing station 8.

A manipulator assembly shown generally by reference numeral 44 includes a platform 46 which has an engagement mechanism 48 for engaging the vertical guide 42. The manipulator assembly 44 further includes a manipulator arm 50 and engagement head 52 adapted to engage the cassette 14. By vertical operation of the platforms 36 and 46, and by operation of the manipulator assembly 44, the cassette 14 is moved from its position on the box door 32 (which, along with the port door 32, is supported on the platform 36), to a position on an internal equipment station 13, as shown by the broken lines.

A common advantage of the conventional SMIF system is that dust and other potential wafer-contaminating particles are sandwiched between the box door 32 and the port door 28 upon attachment of the pod 18 to the port assembly 24. This sandwiching action immobilizes most of the contaminants to prevent them from falling on the semiconductor wafers 16 as the wafer cassette 14 is withdrawn from the interior region 21 of the box 20 of the pod 18 and into the processing station 8. However, some of the contaminants may become dislodged from between the box door 32 and the port door 28 and fall on the wafers 16. Conventional methods for cleaning the bottom surface of the box door 32 to minimize the presence of particulate contaminants thereon include manual wiping, but this method leaves many of the potentially contaminating particles on the box door 32 and consumes unnecessary manpower.

Referring next to FIGS. 2–5 of the drawings, an illustrative embodiment of the apparatus of the present invention is generally indicated by reference numeral 55. As particularly illustrated in FIG. 4, the apparatus 55 includes a typically rectangular or box-shaped housing 56 having a housing interior 57, which housing 56 may be any suitable alternative configuration. A panel opening 65 is provided in the top panel 64 of the housing 56. An air sprinkler shroud 59 in the housing interior 57 includes a pair of sloped shroud sides 60 which define a shroud interior 62 beneath the panel opening 65. A particle drain tube 61 may connect the bottom portion of the air sprinkler shroud 59 to a vacuum 85 contained in the housing interior 57, for purposes hereinafter described. Rod support strips 67, typically constructed of rubber, plastic or other material, are provided on the top panel 64 of the housing 56, adjacent to respective edges of the panel opening 65 for purposes hereinafter described.

An air supply conduit 78 extends from an exterior source of clean, dry air (CDA) 84 into the housing interior 57. Alternatively, the CDA source 84 may be provided in the housing interior 57 or elsewhere on the housing 56. In the housing interior 57, the air supply conduit 78 typically includes a horizontal segment 80 and a vertical segment 79 which extends substantially perpendicularly upwardly from the horizontal segment 80. The horizontal segment 80 extends through an opening (not illustrated) in the particle drain tube 61, where the vertical segment 79 extends upwardly into the shroud interior 62. An electric air valve 82 is incorporated in the horizontal segment 80 to control flow of pressurized clean dry air from the CDA source 84 and into the vertical segment 79 of the air supply conduit 78.

An air sprinkler 70 is rotatably mounted on the upper end of the vertical segment 79 of the air supply conduit 78, inside the shroud interior 62, and includes a hub 71 having an interior hub air passage 96 (FIG. 5) that is disposed in pneumatic communication with a vertical segment air passage 95 inside the vertical segment 79 of the air supply conduit 78. The hub 71 is coupled in airtight configuration with the vertical segment 79 by means of an airtight swivel joint (not illustrated), according to the knowledge of those skilled in the art, and is capable of rotating with respect to the stationary or non-rotating vertical segment 79.

Figure 2:
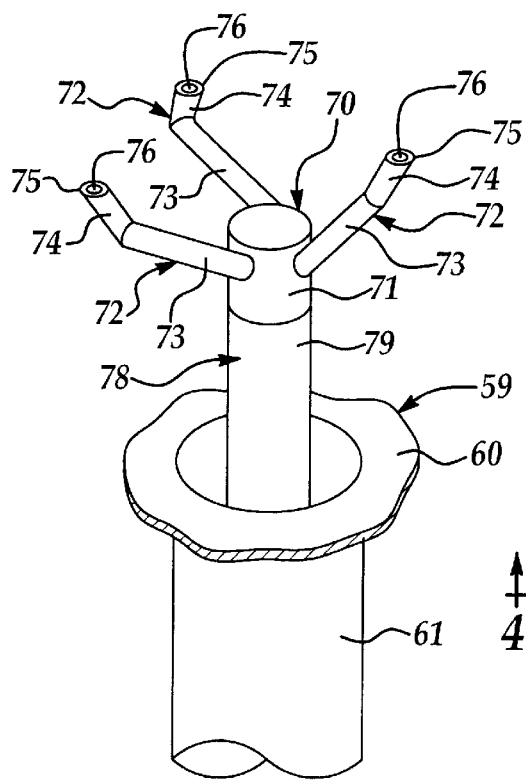
FIG. 2 is a perspective view, partially in section, of a typical air sprinkler element of the apparatus of the present invention.
Figure 3:
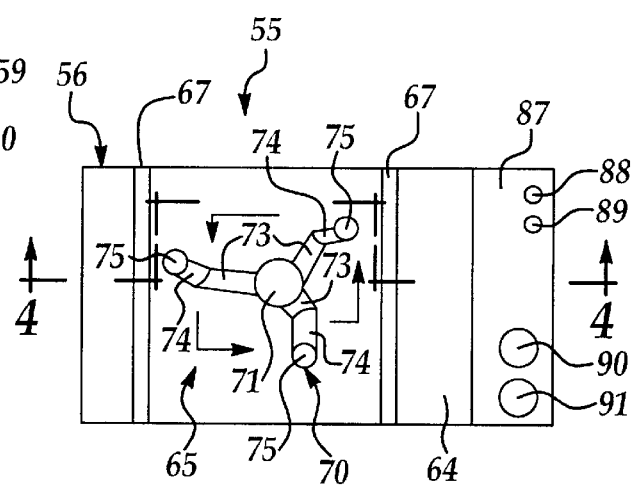
FIG. 3 is a top view of the apparatus of the present invention.

The air sprinkler 70 further includes multiple sprinkler arms 72 which extend in equal circumferentially-spaced relationship to each other from the hub 71. While three sprinkler arms 72 are shown in the drawings, it is understood that two, four, or any suitable number of sprinkler arms 72 may be provided on the hub 71. As illustrated in FIG. 2, each of the sprinkler arms 72 includes a proximal arm segment 73 which extends directly from the hub 71 and a distal arm segment 74 which extends from the proximal arm segment 73, upwardly and at an angle with respect to the longitudinal axis of the proximal arm segment 73, as particularly illustrated in FIG. 3. Alternatively, the distal arm segment 74 may curve from the proximal arm segment 73 instead of bending therefrom at an angle. Each of the distal arm segments 74 angles or curves from the corresponding proximal arm segment 73 in a direction which is opposite the direction of rotation of the air sprinkler 70 illustrated by the arrows in FIG. 3. For example, the air sprinkler 70 shown in FIG. 3 is designed to rotate in a counterclockwise direction when viewed from above as in FIG. 3, as indicated by the arrows, and the distal arm segments 74 angle or curve from the respective proximal arm segments 73 in a clockwise direction.

Figure 5:
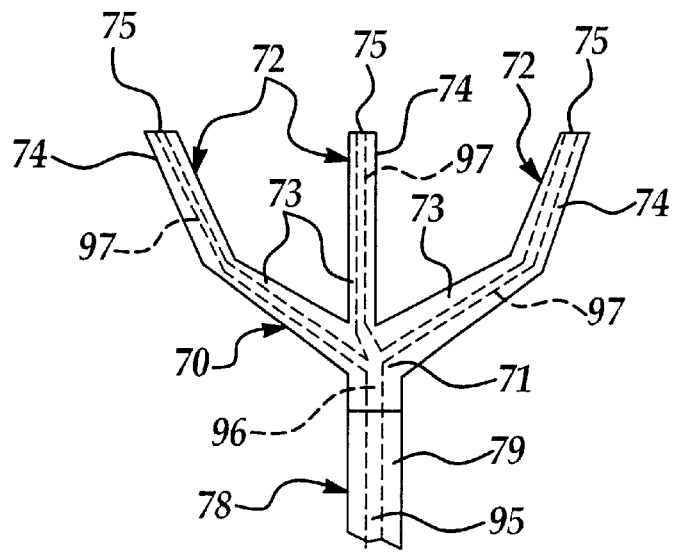
FIG. 5 is a side view, partially in section, of a typical air sprinkler element of the apparatus of the present invention, more particularly illustrating in phantom a system of air passages in the air sprinkler.

Each distal arm segment 74 terminates in a planar air nozzle 75, having a nozzle opening 76 which communicates with a corresponding sprinkler arm air passage 97 that traverses the interior of each sprinkler arm 72 and communicates with the hub air passage 96, as illustrated in phantom in FIG. 5. Each of the air nozzles 75 is typically disposed in a substantially horizontal plane. Accordingly, because of the angled or offset configuration of each distal arm segment 74 with respect to the corresponding proximal arm segment 73, clean dry air ejected from the nozzle openings 76 creates a jet propulsion effect which drives the air sprinkler 70 in a typically counterclockwise direction, as illustrated in FIG. 3, as the air sprinkler 70 rotates on the vertical segment 79 of the air supply conduit 78. It is understood that the distal arm segments 74 may alternatively angle or curve from the proximal arm segments 73 in a counterclockwise direction when the air sprinkler 70 is viewed from above as in FIG. 3, in which case the air sprinkler 70 wound rotate in a clockwise direction.

Figure 4:
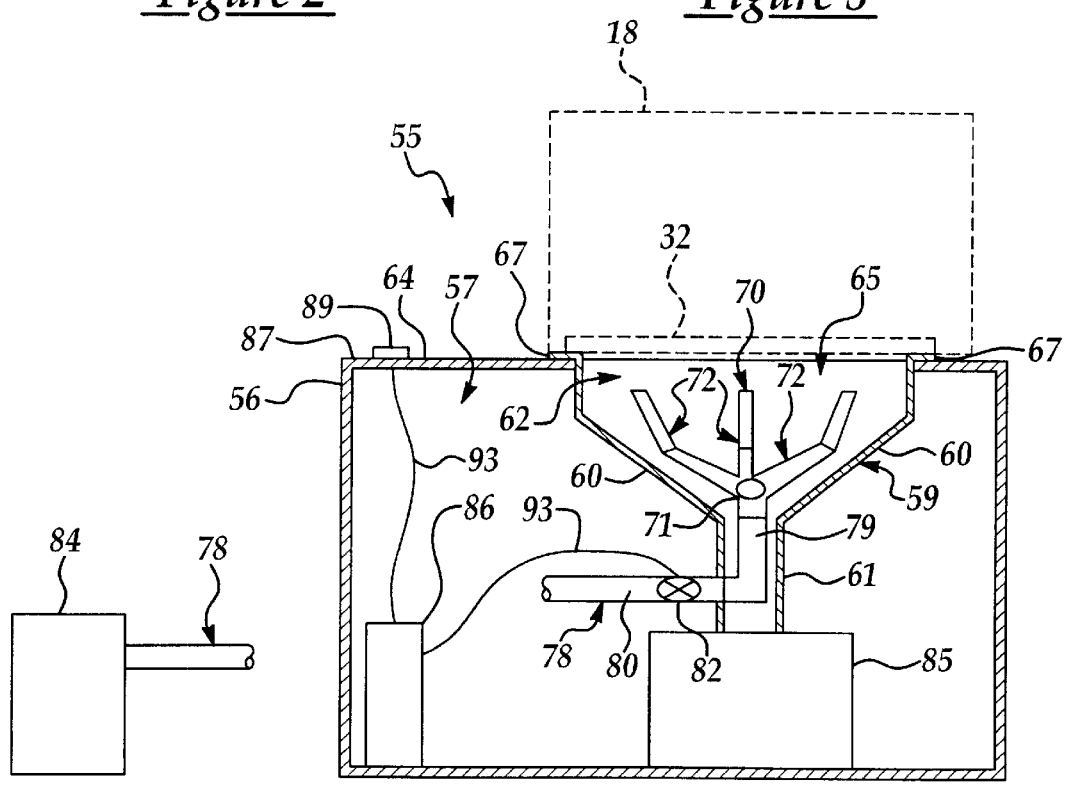
FIG. 4 is a longitudinal sectional view, taken along section lines 4—4 in FIG. 3, of the apparatus of the present invention, with a wafer pod (shown in phantom) positioned on the apparatus for removal of particulate contaminants from the pod in typical application.
Figure 6:
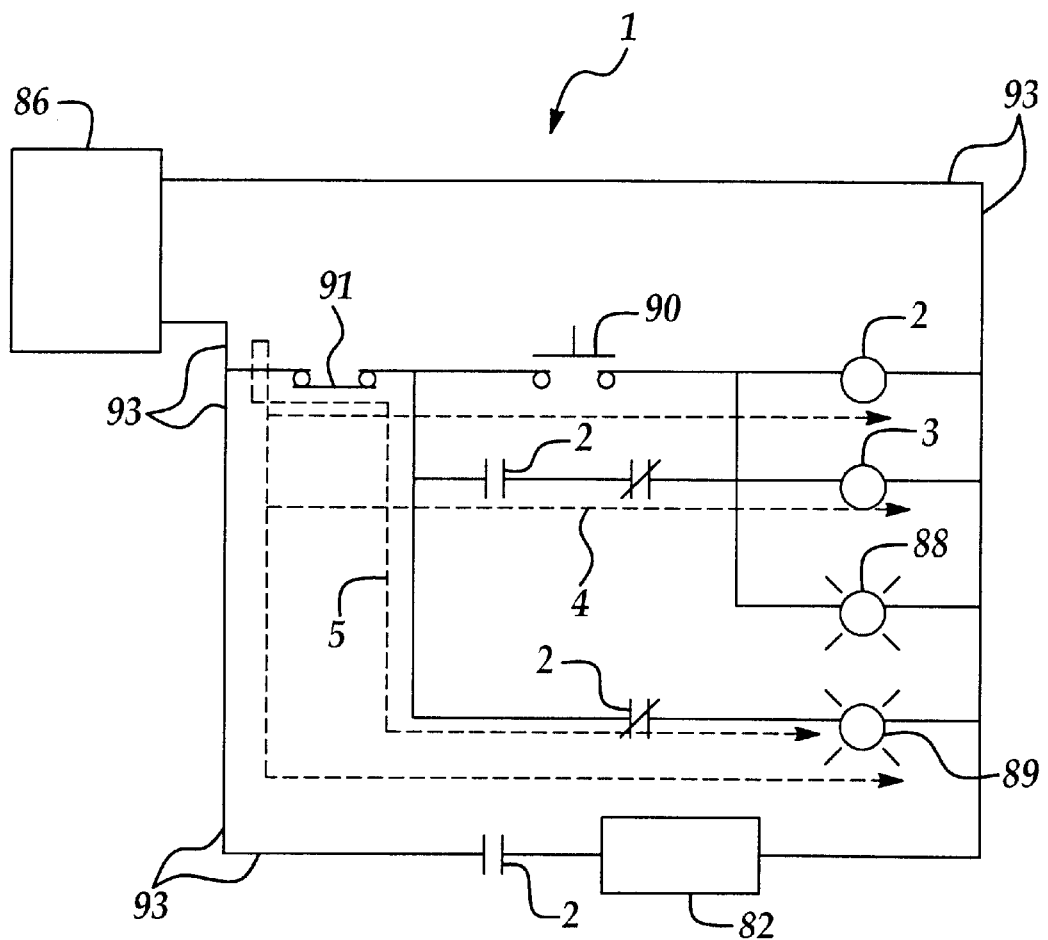
FIG. 6 is a schematic view of a typical control circuit for the apparatus of the present invention.

A typical control circuit for the apparatus 55 is generally indicated by reference numeral 1 in FIG. 6. The control circuit 1 includes a step-down transformer 86, which typically reduces an alternating current of 110 volts from a power source (not illustrated) to a direct current of 24 volts. The transformer 86 is typically contained in the housing interior 57, as illustrated in FIG. 4. A "power on" switch 90 and a "power off" switch 91, typically provided adjacent to each other on a control panel 87 of the housing 56, are connected to the transformer 86 by means of wiring 93. Additional wiring 93 connects the transformer 86 to the electric air valve 83 in the horizontal segment 80 of the air supply conduit 78. A red light 88 and a green light 89 are provided in the control circuit 1, typically adjacent to each other on the control panel 87. A relay 2 and a timer 3 (which may also be provided on the control panel 87) are further provided in the control circuit 1. The timer 3 may be set for a selected period of time, such as 30 minutes, for example, for energizing the electric air valve 82 for the same length of time. Accordingly, energizing the control circuit 1 by operation of the "power on" switch 90 causes flow of an "on" current along the path indicated by reference numeral 4, such that the relay 2 is activated. The relay 2, in turn, activates the timer 3 to energize and open the electric air valve 82 to allow flow of clean dry air typically at a pressure of about 80 psi from the CDA source 84, through the air supply conduit 78 to the air sprinkler 70. The current further flows through and energizes the red light 88, which indicates the "on" or "open" configuration of the electric air valve 82. After the selected time period preset for the timer 3 has expired, flow of current along the circuit pathway 4 is terminated and the electric air valve 82 closes to prevent further flow of clean dry air to the air sprinkler 70. Simultaneously, the red "on" light 88 is extinguished and current flows along the current path indicated by the reference numeral 5, and flows through and energizes the green "off" light 89 to indicate the "off" or "closed" configuration of the electric air valve 82. Alternatively, the "power off" switch 91 may be activated before the timer 3 expires to switch flow of current from the "on" circuit pathway 4 to the "off" current pathway 5.

Referring again to FIGS. 4 and 5 of the drawings, in typical application the apparatus 55 is used to remove dust and other potential wafer-contaminating particles from the bottom surface of the box door 32 of the pod 18. Accordingly, the wafer pod 18 is initially placed on the housing 56 with the box door 32 resting on the parallel pod support strips 67 and spanning the panel opening 65. The timer 3 (FIG. 6) may then be adjusted to preset the operation time, typically 30 minutes, for the air sprinkler 70. The "power on" switch 90, typically located on the control panel 87, is then actuated to energize and open the electric air valve 82, as heretofore described with respect to the control circuit 1 in FIG. 6. Accordingly, clean dry air is distributed under pressure, typically about 80 psi, from the CDA source 84 and through the horizontal segment 80, open electric air valve 82 and vertical segment 79 of the air supply conduit 78. From the vertical segment air passage 95 (FIG. 5) in the vertical segment 79, the air enters the internal hub air passage 96 of the air sprinkler hub 71 and then enters the sprinkler arm air passages 97 of the respective sprinkler arms 70. Finally, the air is ejected from the air nozzles 75 of the respective sprinkler arms 70, and the resulting jet propulsion effect causes the air sprinkler 70 to rotate typically in the counterclockwise direction in FIG. 3 when viewed from above, as heretofore described. The ejected air directly impinges on the bottom surface of the box door 32 to dislodge the dust and other particles therefrom. The dislodged dust and other particles fall from the box door 32 and onto the sloped shroud sides 60 of the air sprinkler shroud 59, which funnels the particles into the underlying particle drain tube 61. The vacuum 85 may be operated to draw particles adhering to the surfaces of the shroud sides 60 and particle drain tube 61, from those surfaces and into a collection receptacle (not illustrated) in the vacuum 85. After rotation of the air sprinkler 70 is terminated due to closure of the electric air valve 82 by operation of the timer 3 or "power off" switch 91, the pod 18 is removed from the housing 56 and may be transported to another location in the semiconductor production plant, such as a processing station 8 (FIG. 1A), by means of suitable transport equipment (not illustrated). In that case, the pod 18 is attached to the processing station 8 for the internalization of semiconductor wafers 16 from the pod 18 into the processing station 8, as heretofore described with respect to FIGS. 1A and 2A, and very few, if any, particles are sandwiched between the box door 32 of the pod 18 and the port door 28 of the port assembly 24 due to cleaning of the port door 32 using the apparatus 55. Consequently, the risk of wafer contamination due to particles becoming dislodged from between the box door 32 and the port door 28 and falling into the processing station 8 during internalization of the wafers 16 is substantially reduced.

It will be appreciated by those skilled in the art that the apparatus 55 is capable of removing up to 100% of the potential wafer-contaminating particles from the bottom surface of a wafer pod 18. In a test of 30 wafer pods 18 cleaned using the apparatus 55, it was found that the average percentage of particles removed from the pod 18 was about 80%.

While the preferred embodiments of the invention have been described above, it will be recognized and understood that various modifications can be made in the invention and the appended claims are intended to cover all such modifications which may fall within the spirit and scope of the invention.

Having described my invention with the particularity set forth above, we claim:

1. An apparatus for removing particles from a surface, comprising:
    a housing, having a housing opening, for receiving the surface over said housing opening;
    an air sprinkler having a plurality of sprinkler arms rotatably mounted in said housing beneath said housing opening;
    a plurality of sprinkler arm air passages extending through said plurality of sprinkler arms, respectively;
    a source of air provided in air communication with said plurality of sprinkler arm air passages for forcing air through said plurality of sprinkler arm air passages; and
    wherein said air sprinkler rotates in said housing and the air is ejected from said sprinkler arms toward said housing opening responsive to flow of the air from said source of air through said plurality of sprinkler arm air passages.

2. The apparatus of claim 1 further comprising an air sprinkler shroud having a shroud interior provided in said housing beneath said housing opening, and wherein said air sprinkler is rotatably mounted in said shroud interior.

3. The apparatus of claim 1 wherein each of said sprinkler arms comprises a proximal arm segment and a distal arm segment disposed at an angle with respect to said proximal arm segment.

4. The apparatus of claim 3 further comprising an air sprinkler shroud having a shroud interior provided in said housing beneath said housing opening, and wherein said air sprinkler is rotatably mounted in said shroud interior.

5. The apparatus of claim 1 further comprising a pair of support strips provided on said housing on respective sides of said housing opening for receiving the surface.

6. The apparatus of claim 5 further comprising an air sprinkler shroud having a shroud interior provided in said housing beneath said housing opening, and wherein said air sprinkler is rotatably mounted in said shroud interior.

7. The apparatus of claim 5 wherein each of said sprinkler arms comprises a proximal arm segment and a distal arm segment disposed at an angle with respect to said proximal arm segment.

8. The apparatus of claim 7 further comprising an air sprinkler shroud having a shroud interior provided in said housing beneath said housing opening, and wherein said air sprinkler is rotatably mounted in said shroud interior.

9. The apparatus of claim 2 further comprising a vacuum provided in communication with said air sprinkler shroud for receiving the particles from said air sprinkler shroud.

10. The apparatus of claim 9 wherein each of said sprinkler arms comprises a proximal arm segment and a distal arm segment disposed at an angle with respect to said proximal arm segment.

11. The apparatus of claim 9 further comprising a pair of support strips provided on said housing on respective sides of said housing opening for receiving the surface.

12. The apparatus of claim 11 wherein each of said sprinkler arms comprises a proximal arm segment and a distal arm segment disposed at an angle with respect to said proximal arm segment.

13. An apparatus for removing particles from a surface, comprising:
    a housing, having a housing opening, for receiving the surface over said housing opening;
    an air sprinkler having a plurality of sprinkler arms rotatably mounted in said housing beneath said housing opening;
    a plurality of sprinkler arm air passages extending through said plurality of sprinkler arms, respectively;
    an air supply conduit provided in pneumatic communication with said plurality of sprinkler arm air passages, respectively;
    a source of air provided in pneumatic communication with said air supply conduit for forcing air through said air supply conduit and said plurality of sprinkler arm air passages;
    a valve provided in said air supply conduit for selectively opening and closing said air supply conduit; and
    wherein said air sprinkler rotates in said housing and the air is ejected from said sprinkler arms toward said housing opening responsive to flow of the air from said source of air through said air supply conduit, said valve and said plurality of sprinkler arm air passages.

14. The apparatus of claim 13 further comprising a timer operably connected to said valve for closing said valve and terminating rotation of said air sprinkler.

15. The apparatus of claim 13 further comprising an air sprinkler shroud having a shroud interior provided in said housing beneath said housing opening, and wherein said air sprinkler is rotatably mounted in said shroud interior.

16. The apparatus of claim 15 further comprising a timer operably connected to said valve for closing said valve and terminating rotation of said air sprinkler.

17. The apparatus of claim 15 further comprising a vacuum provided in communication with said air sprinkler shroud for receiving the particles from said air sprinkler shroud.

18. A method for removing particles from a semiconductor wafer pod, comprising:

providing an apparatus comprising a housing having a housing opening, an air sprinkler having a plurality of sprinkler arms rotatably mounted in said housing beneath said housing opening and a plurality of sprinkler arm air passages extending through said plurality of sprinkler arms, respectively;

providing a source of air in pneumatic communication with said plurality of sprinkler arm air passages;

placing the wafer pod on said housing, over said housing opening; and forcing air from said source of air through said plurality of sprinkler arm air passages to rotate said air sprinkler in said housing and eject the air from said sprinkler arms toward said housing opening and against the wafer pod.

19. The method of claim 18 further comprising providing an air sprinkler shroud beneath said housing opening in said housing and a vacuum in communication with said air sprinkler shroud for removing particles from said air sprinkler shroud.

20. The method of claim 19 further comprising providing a valve between said source of air and said plurality of sprinkler arm air passages for selectively terminating flow of the air from said source of air to said plurality of sprinkler arm air passages and operably connecting a timer to said valve for closing said valve.

* * * * *